US006943406B2

United States Patent
Uchihara et al.

(10) Patent No.: US 6,943,406 B2
(45) Date of Patent: Sep. 13, 2005

(54) SEMICONDUCTOR DEVICE

(75) Inventors: Takeshi Uchihara, Saitama (JP);
Yasunori Usui, Kanagawa (JP);
Hideyuki Ura, Kanagawa (JP);
Takuma Hara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/697,994

(22) Filed: Oct. 30, 2003

(65) Prior Publication Data

US 2004/0262675 A1 Dec. 30, 2004

(30) Foreign Application Priority Data

Jun. 30, 2003 (JP) ........................................ 2003-187996

(51) Int. Cl.[7] ...................... H01L 31/113; H01L 21/332
(52) U.S. Cl. ........................ 257/327; 257/326; 257/328; 257/409; 257/410; 257/489; 257/490; 257/491; 438/138; 438/139; 438/140
(58) Field of Search ................................ 257/326, 327, 257/328, 409, 410, 489, 490, 491, 406, 407, 408, 411; 438/138, 139, 140

(56) References Cited

U.S. PATENT DOCUMENTS

| | | | |
|---|---|---|---|
| 5,155,569 A | * | 10/1992 | Terashima .................. 257/130 |
| 5,648,671 A | | 7/1997 | Merchant |
| 2004/0108544 A1 | * | 6/2004 | Hossain et al. .............. 257/328 |

FOREIGN PATENT DOCUMENTS

JP         07-086580         3/1995

* cited by examiner

*Primary Examiner*—Nathan J. Flynn
*Assistant Examiner*—Fazli Erdem
(74) *Attorney, Agent, or Firm*—Hogan & Hartson, L.L.P.

(57) ABSTRACT

According to the present invention, there is provided a semiconductor device having, a semiconductor substrate having a surface on which an insulating layer is formed, a first-conductivity-type first semiconductor layer formed on the insulating layer and having a first impurity concentration, a first-conductivity-type second semiconductor region formed in the first semiconductor layer from a surface of the first semiconductor layer to a surface of the insulating layer, and having a concentration higher than the first impurity concentration, a second-conductivity-type third semiconductor region formed in the first semiconductor layer from the surface of the first semiconductor layer to the surface of the insulating layer with a predetermined distance between the second and third semiconductor regions, and having a second impurity concentration, a second-conductivity-type fourth semiconductor region formed in a surface portion of the second semiconductor region, and having a concentration higher than the second impurity concentration, an insulating film formed over the surfaces of the first, second, third, and fourth semiconductor layers, and a control electrode formed on the insulating film, wherein a junction of first and second conductivity types formed between the first semiconductor layer and the third semiconductor region is positioned below the control electrode, or below an end portion, on a side of the third semiconductor region, of the control electrode, via the insulating film.

18 Claims, 5 Drawing Sheets

SEMICONDUCTOR DEVICE

CROSS REFERENCE TO RELATED APPLICATION

This application is based upon and claims benefit of priority under 35 USC 119 from the Japanese Patent Application No. 2003-187996, filed on Jun. 30, 2003, the entire contents of which are incorporated herein by reference.

BACKGROUND OF THE INVENTION

The present invention relates to a semiconductor device.

As the degree of integration of semiconductor devices increases, devices such as a MOSFET used in the output stage are required to have a high drain voltage and a low ON resistance. To meet these demands, patent reference 1 (to be described later) discloses a device using a semiconductor substrate (SOI (Silicon On Insulator) substrate) having an insulating layer.

This conventional device realizes a high drain voltage and a low ON resistance. However, a junction area present between an n-type offset layer 7 and p-type high-resistance semiconductor layer 3 shown in FIG. 1 of this reference is large. This increases the output capacitance in this junction portion.

The following is the name of the reference disclosing this conventional semiconductor device.

Japanese Patent Publication No. 07-086580

As described above, the conventional semiconductor device has the problem that the output capacitance cannot be reduced.

SUMMARY OF THE INVENTION

According to one aspect of the present invention, there is provided a semiconductor device comprising:

a semiconductor substrate having a surface on which an insulating layer is formed;

a first-conductivity-type first semiconductor layer formed on said insulating layer and having a first impurity concentration;

a first-conductivity-type second semiconductor region formed in said first semiconductor layer from a surface of said first semiconductor layer to a surface of said insulating layer, and having a concentration higher than the first impurity concentration;

a second-conductivity-type third semiconductor region formed in said first semiconductor layer from the surface of said first semiconductor layer to the surface of said insulating layer with a predetermined distance between said second and third semiconductor regions, and having a second impurity concentration;

a second-conductivity-type fourth semiconductor region formed in a surface portion of said second semiconductor region, and having a concentration higher than the second impurity concentration;

an insulating film formed over the surfaces of said first, second, third, and fourth semiconductor layers; and a control electrode formed on said insulating film, wherein a junction of first and second conductivity types formed between said first semiconductor layer and said third semiconductor region is positioned below said control electrode, or below an end portion, on a side of said third semiconductor region, of said control electrode, via said insulating film.

DESCRIPTION OF THE PREFERRED EMBODIMENTS

Embodiments of the present invention will be described below with reference to the accompanying drawings.

(1) First Embodiment

Figure 1:
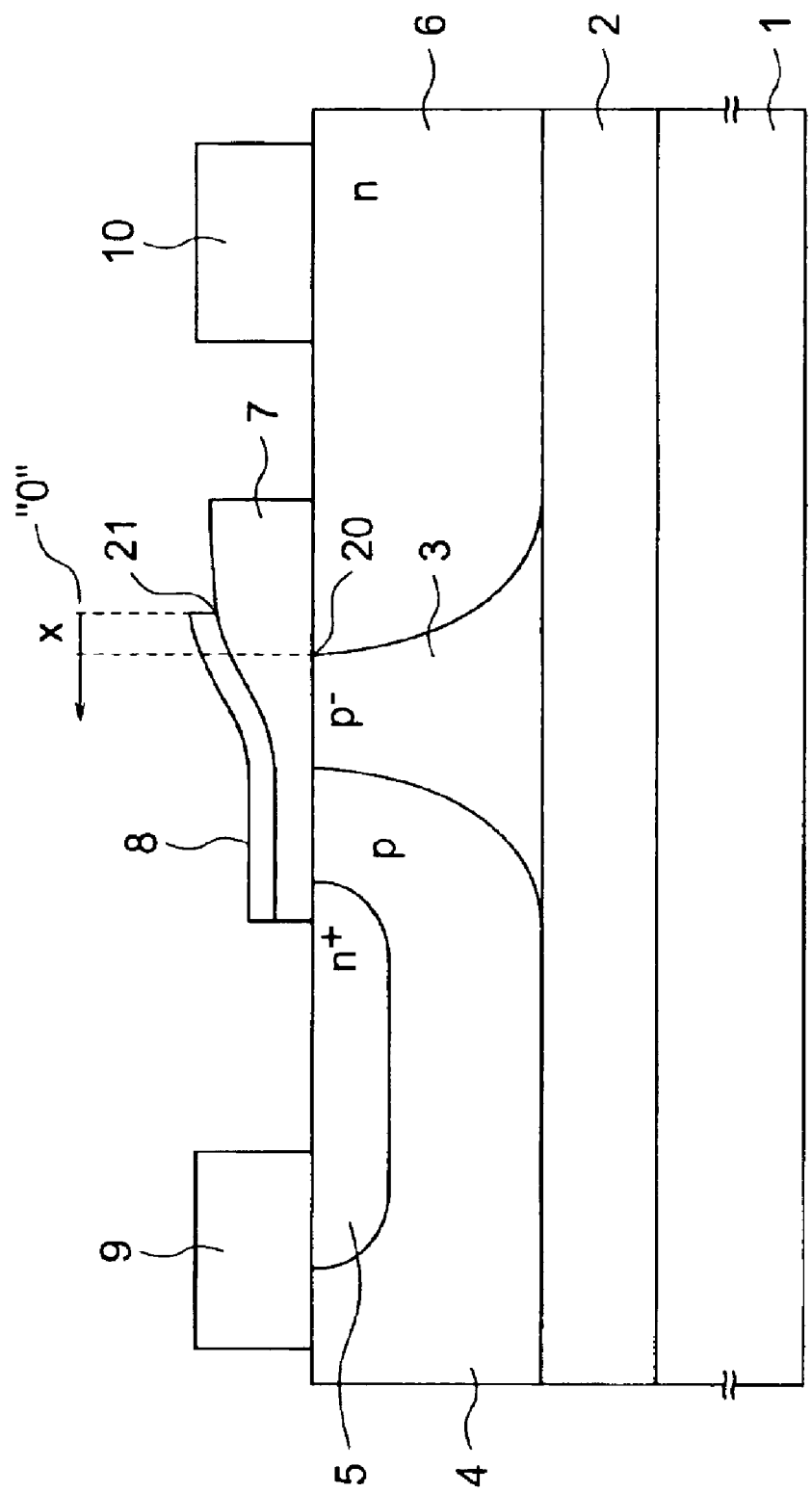
FIG. 1 is a longitudinal sectional view showing the sectional structure of a semiconductor device according to the first embodiment of the present invention.

FIG. 1 shows the sectional structure of a semiconductor device according to the first embodiment of the present invention.

This device is formed using an SOI substrate. On the surface of a semiconductor substrate 1, a high-resistance, p⁻-type active layer 3 is formed via an insulating layer 2. The impurity concentration of the p⁻-type active layer 3 is desirably, e.g., $1 \times 10^{15}$ cm$^{-3}$ or less.

In the p⁻-type active layer 3, a p-type base layer 4 is selectively formed deep enough to reach the insulating layer 2 from the surface. The p-type base layer 4 has an impurity concentration higher than that of the p⁻-type active layer 3, and has functions of preventing punch-through and controlling the threshold value.

An n⁺-type source layer 5 is selectively formed in a surface portion of the p-type base layer 4. A source electrode 9 is connected to the surface of the p-type base layer 4 and the surface of the n⁺-type source layer 5.

Also, in the p⁻-type active layer 3, an n-type drain layer 6 is selectively formed deep enough to reach the insulating layer 2 from the surface with a predetermined spacing, e.g., 0.5 μm or less, between the p-type base layer 4 and n-type drain layer 6. A drain electrode 10 is formed on the surface of the n-type drain layer 6.

A control electrode 8 is formed via an insulating film 7 on the surfaces of the n⁺-type source layer 5, p-type base layer 4, p⁻-type active layer 3, and n-type drain layer 6.

The film thickness of the insulating film 7 is substantially constant and small on the surfaces of the n⁺-type source layer 5 and p-type base layer 4, and continuously changes so as to increase from the surface of the p⁻-type active layer 3 to the surface of the n-type drain layer 6. For example, the thickness of the thinnest portion below the control electrode 8 is desirably 50 to 150 nm, and the thickness of the thickest portion below the control electrode 8 is desirably 150 to 450 nm.

In the semiconductor device according to this embodiment having the above arrangement, the n-type drain layer 6 is formed deep enough to reach the insulating film 2. This reduces the area of a p-n junction formed between the n-type drain layer 6 and p⁻-type active layer 3. Since this reduces the drain/source capacitance, the output capacitance can be reduced.

Also, since the p⁻-type active layer 3 has a low impurity concentration and a high resistance, a depletion layer formed in the p-n junction between the n-type drain layer 6 and p⁻-type active layer 3 can largely expand. This increases the length of the depletion layer in the p-n junction, so the drain/source capacitance can be further reduced.

In this embodiment, the n-type drain layer 6 is formed deep enough to reach the insulating layer 2, and the p-type base layer 4 is also formed deep enough to reach the insulating layer 2. Positive electric charge is present in the interface between the insulating layer 2 and p⁻-type active layer 3, and an n⁻-type inversion layer is formed in the interface of the p⁻-type active layer 3.

Accordingly, when the n-type drain layer 6 is formed to reach the insulating layer 2, this n⁻-type inversion layer and the n-type drain layer 6 are connected. If the n⁻-type inversion layer is long, a leakage current readily flows through this portion. Therefore, the p-type base layer 4 is formed to reach the insulating layer 2 and stop the n⁻-type inversion layer, thereby preventing the leakage current.

The film thickness of the insulating film 7 is small on the surfaces of the n⁺-type source layer 5 and p-type base layer 4 to improve the characteristics, and continuously increases from the surface of the p⁻-type active layer 3 to the surface of the n-type drain layer 6 in order to increase the withstand voltage.

Figure 2:
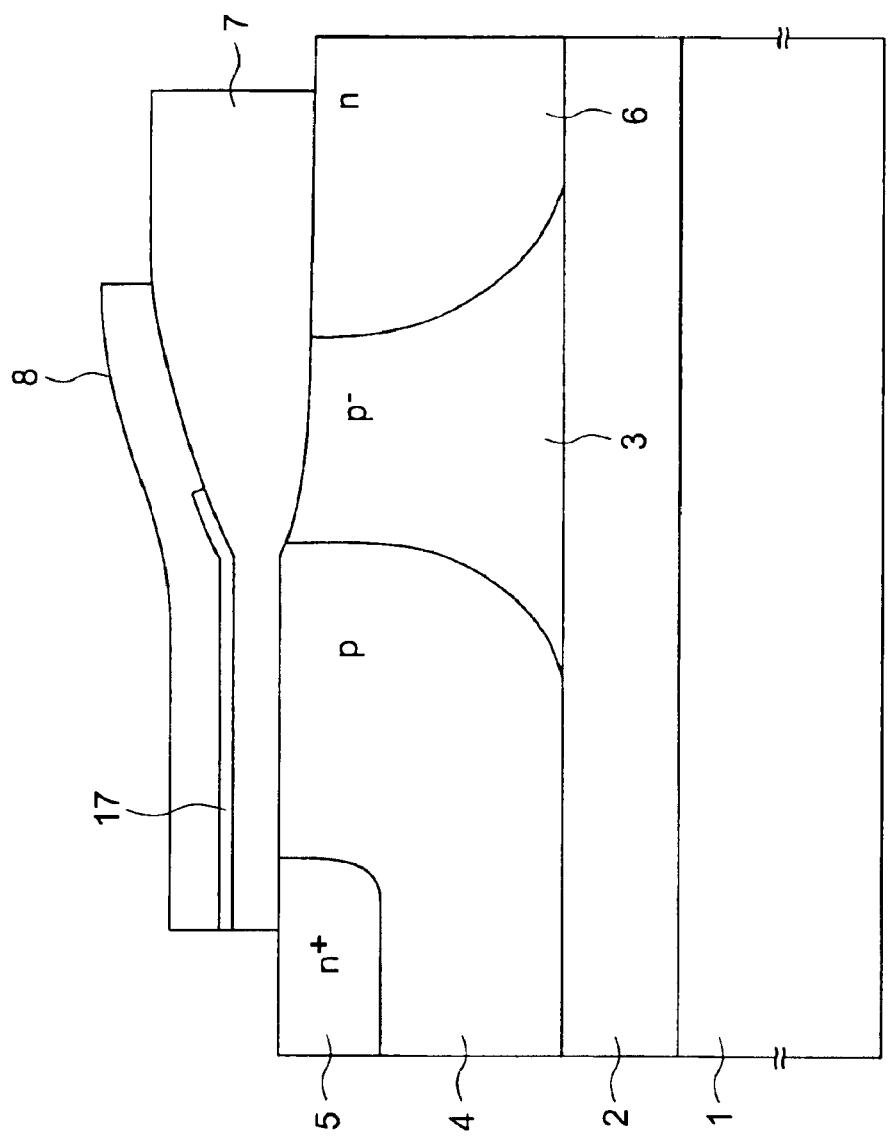
FIG. 2 is a partially enlarged view showing, in an enlarged scale, an insulating film below a control electrode of the semiconductor device according to the first embodiment.

FIG. 2 shows the insulating film 7 and its vicinity in an enlarged scale.

The insulating film 7 can also be formed by, e.g., LOCOS which is used in the formation of an element isolation region. In this case, a silicon nitride film 17 is formed on the surface of the thin portion of the insulating film 7. The film thickness of the portion on which the silicon nitride film 17 is not formed continuously increases.

In this structure, the control electrode 8 can also be successively formed while the silicon nitride film 17 remains. This makes the step of removing the silicon nitride film 17 unnecessary. Alternatively, the control electrode 8 can be formed after the silicon nitride film 17 is removed.

(2) Second Embodiment

A semiconductor device according to the second embodiment of the present invention will be explained below.

In the above first embodiment, the positional relationship between the control electrode 8 and an end portion 20 of the p-n junction between the p⁻-type semiconductor layer 3 and n-type drain layer 6 is not limited.

In this embodiment, however, an end face 21, on the side of an n-type drain 6, of a control electrode 8 shown in FIG. 1 is X-coordinate "0", and a distance x from this position to an end portion 20 of a p-n junction between a p⁻-type semiconductor layer 3 and the n-type drain layer 6 is limited. The distance x falls within the range of $0 \leq x \leq 0.8$ μm.

In this embodiment as described above, the position 20 of the p-n junction formed on the surface of the p⁻-type active layer 3 between the p⁻-type active layer 3 and n-type drain region 6 is close to the end face 21 of the control electrode 8. This makes it possible to ensure the drain voltage and reduce the product (CR product) of ON resistance×output capacitance. This will be explained in more detail below with reference to FIGS. 3 and 4.

Figure 3:
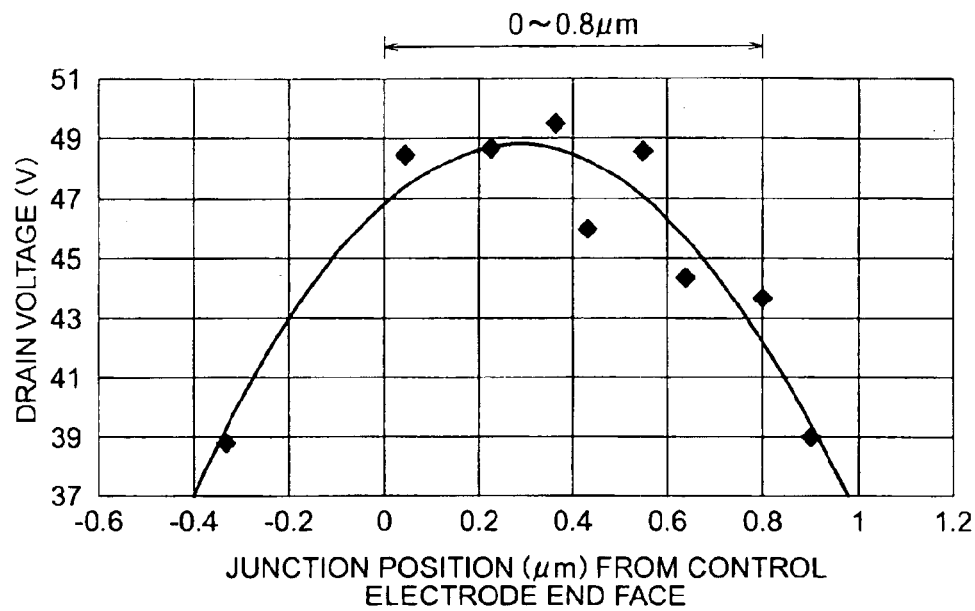
FIG. 3 is a graph showing the relationship between the position of a p-n junction from the end face of a control electrode and the withstand voltage in. a semiconductor device according to the second embodiment of the present invention.

FIG. 3 shows the relationship between the distance x from the end face 21, on the side of the n-type drain 6, of the control electrode 8 to the position of the end portion 20 of the p-n junction between the p⁻-type active layer 3 and n-type drain region 6, and the withstand voltage pertaining to the drain voltage. This graph shows that if, for example, a necessary withstand voltage is 43 V or more, the distance x is within the range of $-0.2$ μm $\leq x \leq 0.8$ μm.

Since the end portion 20 of the p-n junction is desirably positioned below the control electrode 8 in order to improve the characteristics, the distance x is within the range of 0 μm $\leq x \leq 0.8$ μm.

Figure 4:
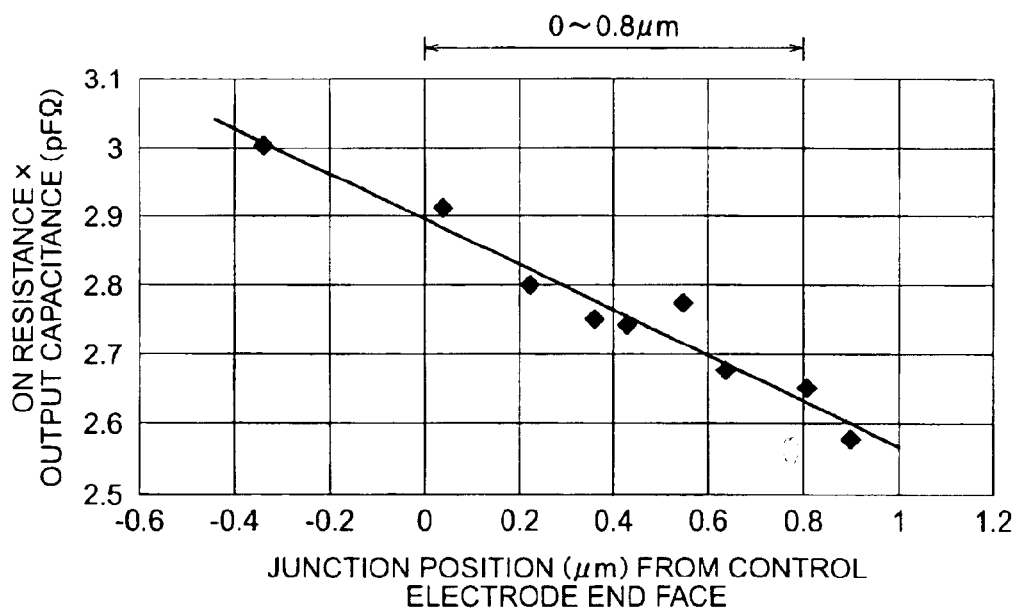
FIG. 4 is a graph showing the relationship between the p-n junction position from the control electrode end face and ON resistance×output capacitance in the semiconductor device according to the second embodiment.

FIG. 4 shows the relationship between the distance x from the end face 21, on the side of the n-type drain 6, of the control electrode 8 to the position of the end portion 20 of the p-n junction between the p⁻-type active layer 3 and n-type drain region 6, and ON resistance×OFF output capacitance (CR product).

This graph indicates that the larger the distance x, the smaller the CR product, and the more desirable the characteristics.

The CR product within the range of 0 μm $\leq x \leq 0.8$ μm which is calculated from the withstand voltage characteristic is 2.64 pFΩ $\leq$ CR product $\leq$ 2.90 pFΩ.

As shown in FIGS. 3 and 4, the larger the distance x from the end face 21 of the control electrode 8 to the end portion 20 of the p-n junction, the smaller the CR product. However, if the distance x is too large, no withstand voltage can be assured any longer. Also, if the distance x is too small, the withstand voltage lowers, and the CR product increases.

In this embodiment as described above, therefore, it is possible to ensure a desired withstand voltage and suppress an increase in CR product by limiting the distance x to 0 μm $\leq x \leq 0.8$ μm.

When the insulating film 7 below the control electrode 8 is so formed that the film thickness of the insulating film 7 continuously changes, stress damage may be given to the surface of the p⁻-type active layer 3 to lower the channel mobility. However, the influence of this stress damage can be reduced by setting the position of the end portion 20 of the p-n junction as described above, so that the end face 21 of the control electrode 8 and the position of the end portion 20 of the p-n junction overlap.

(3) Third Embodiment

Figure 5:
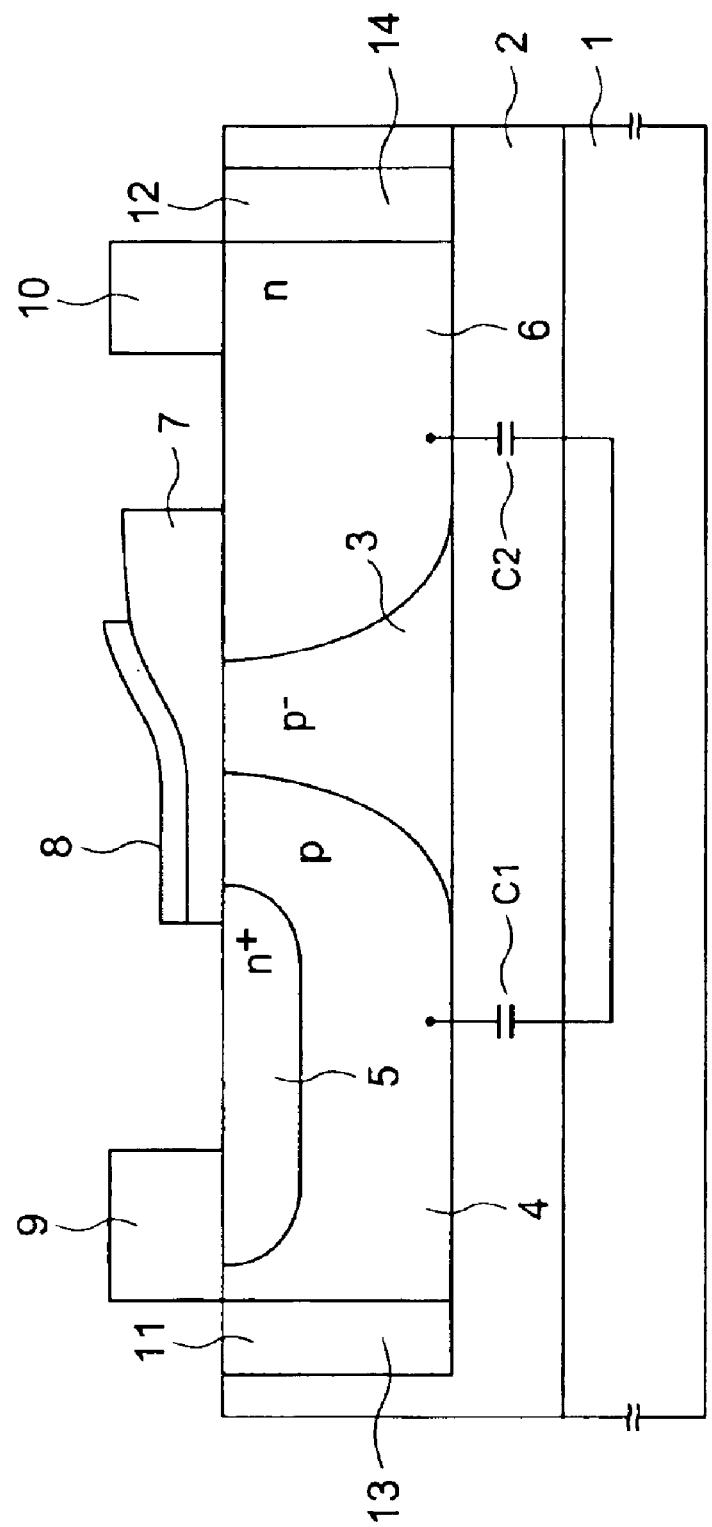
FIG. 5 is a longitudinal sectional view showing the sectional structure of a semiconductor device according to the third embodiment of the present invention.

FIG. 5 shows the sectional structure of a semiconductor device according to the third embodiment of the present invention.

As in the first embodiment described earlier, the semiconductor device of this embodiment is also formed using an SOI substrate. On the surface of a semiconductor substrate 1, a high-resistance, p⁻-type active layer 3 is formed via an insulating layer 2.

As in the first embodiment, in the p⁻-type active layer 3, a p-type base layer 4 for preventing punch-through and controlling the threshold value is selectively formed deep enough to reach the insulating layer 2 from the surface. An n⁺-type source layer 5 is selectively formed in a surface portion of the p-type base layer 4. A source electrode 9 is connected to the surface of the p-type base layer 4 and the surface of the n⁺-type source layer 5.

In the p⁻-type active layer 3, an n-type drain layer 6 is selectively formed deep enough to reach the insulating layer 2 from the surface with a predetermined spacing between the p-type base layer 4 and n-type drain layer 6. A drain electrode 10 is formed on the surface of the n-type drain layer 6.

A control electrode 8 is formed via an insulating film 7 on the surfaces of the n⁺-type source layer 5, p-type base layer 4, p⁻-type active layer 3, and n-type drain layer 6.

The film thickness of the insulating film 7 is substantially constant and small on the surfaces of the n⁺-type source layer 5 and p-type base layer 4, and continuously changes so as to increase from the surface of the p⁻-type active layer 3 to the surface of the n-type drain layer 6.

In addition, unlike in the first embodiment described previously, trenches 11 and 12 are formed in this embodiment. That is, on the surface of the p-type base layer 4, the trench 11 reaches the insulating layer 2 from the surface near the end face of the source electrode 9 on the side away from the control electrode 8. On the surface of the n-type drain layer 6, the trench 12 reaches the insulating layer 2 from the surface near the end face of the drain electrode 10 on the side away from the control electrode 8.

The trenches 11 and 12 are filled with insulating films 13 and 14 such as silicon oxide films or polysilicon films into which no impurity is doped.

As shown in FIG. 5, capacitances C1 and C2 are present via the insulating film 2 between the n-type drain layer 6 and p-type base layer 4. In this embodiment, the trenches 11 and 12 reduce the junction areas between the n-type drain layer 6 and semiconductor substrate 1, and between the p-type base layer 4 and semiconductor substrate 1, thereby reducing the capacitances C1 and C2 between them. As a consequence, the source/drain parasitic capacitance can be reduced.

Also, as in the first embodiment, the n-type drain layer 6 is formed to reach the insulating layer 6. This reduces the area of the p-n junction formed between the n-type drain layer 6 and p$^-$-type active layer 3. Accordingly, the drain/source capacitance reduces, and this reduces the output capacitance.

In addition, since the p$^-$-type active layer 3 has a low impurity concentration and a high resistance, a depletion layer formed in the p-n junction between the n-type drain layer 6 and p$^-$-type active layer 3 can largely expand. This increases the length of the depletion layer in the p-n junction, so the drain/source capacitance can be further reduced.

(4) Fourth Embodiment

Figure 6:
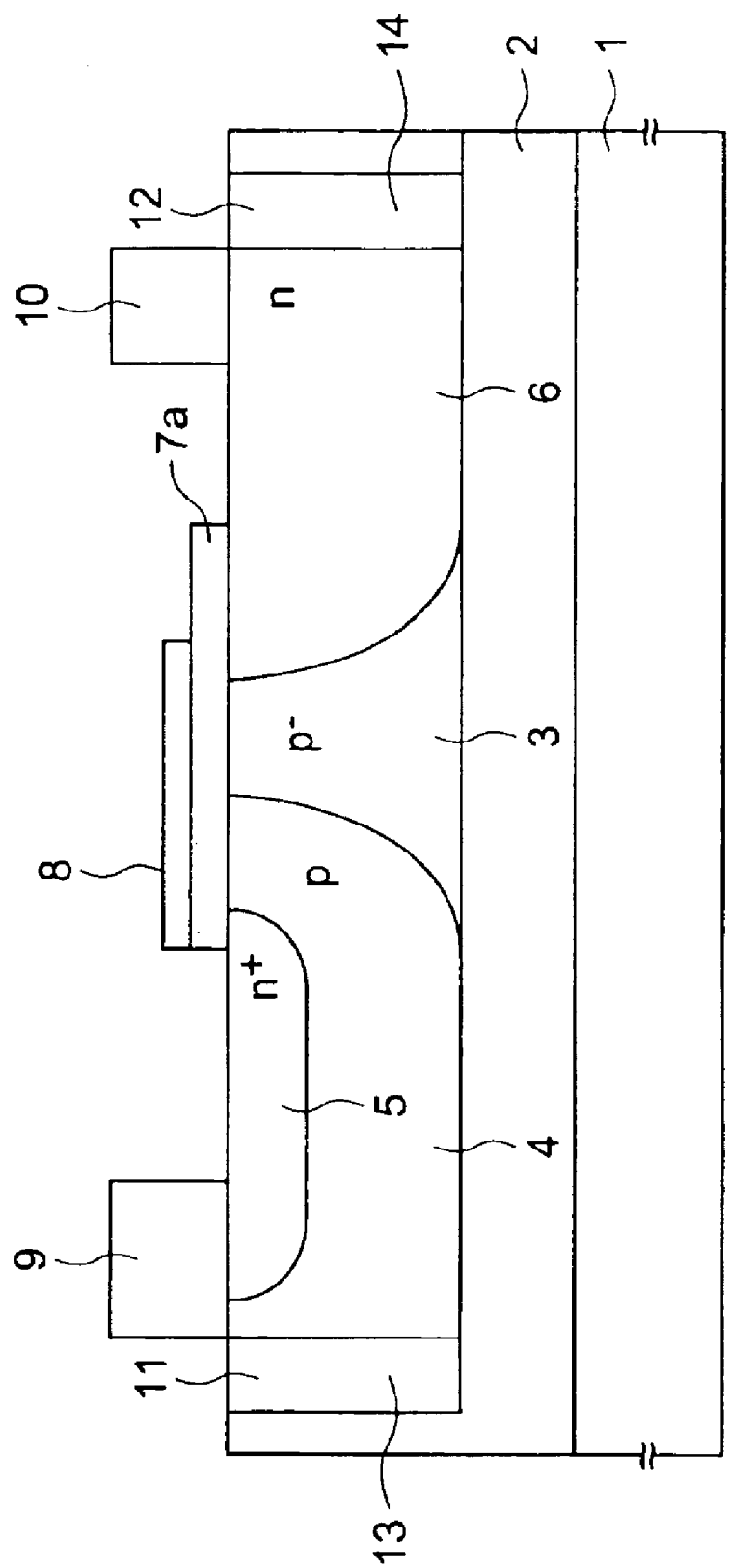
FIG. 6 is a longitudinal sectional view showing the sectional structure of a semiconductor device according to the fourth embodiment of the present invention.

The fourth embodiment of the present invention will be described below with reference to FIG. 6.

In each of the first to third embodiments described above, the film thickness of the insulating film 7 is substantially constant and small on the surfaces of the n$^+$-type source layer 5 and p-type base layer 4, and continuously changes so as to increase from the surface of the p$^-$-type active layer 3 to the surface of the n-type drain layer 6.

This is so because, as described previously, the insulating film 7 is formed so as to continuously increase its thickness only in a necessary portion, i.e., from the surface of the p-type active layer 3 to the surface of the n-type drain layer 6, in order to obtain a high withstand voltage of, e.g., 40 V or more. The rest of the insulating film 7 is made thin on the surfaces of the n$^+$-type source layer 5 and p-type base layer 4, in order to improve the characteristics.

In contrast, this embodiment is based on the use at a relatively low withstand voltage of, e.g., about 20 V. In a case like this, good characteristics are obtained when an insulating film 7a is made thin. Also, to simplify the fabrication process, the film thickness is substantially constant and relatively small.

The above embodiments are merely examples and hence do not limit the present invention.

For examples, the conductivity types can be different from those in the above embodiments. In addition, the insulating film below the control electrode may also be formed by a method other than LOCOS used in the embodiments.

In the semiconductor device according to each embodiment of the present invention described above, a second-conductivity-type semiconductor region formed on the surface of a first-conductivity-type semiconductor layer on an insulating layer is formed deep enough to reach the insulating layer. Since this reduces the area of a junction of the first and second conductivity types present between the first-conductivity-type semiconductor layer and second-conductivity-type semiconductor region, the output capacitance can be reduced.

What is claimed is:

1. A semiconductor device comprising:
    a semiconductor substrate having a surface on which an insulating layer is formed;
    a first-conductivity-type first semiconductor layer formed on said insulating layer and having a first impurity concentration;
    a first-conductivity-type second semiconductor region formed in said first semiconductor layer from a surface of said first semiconductor layer to a surface of said insulating layer, and having a concentration higher than the first impurity concentration;
    a second-conductivity-type third semiconductor region formed in said first semiconductor layer from the surface of said first semiconductor layer to the surface of said insulating layer with a predetermined distance between said second and third semiconductor regions, and having a second impurity concentration;
    a second-conductivity-type fourth semiconductor region formed in a surface portion of said second semiconductor region, and having a concentration higher than the second impurity concentration;
    an insulating film formed over the surfaces of said first, second, third, and fourth semiconductor layers; and
    a control electrode formed on said insulating film,
    wherein a junction of first and second conductivity types formed between said first semiconductor layer and said third semiconductor region is positioned below an end portion, on a side of said third semiconductor region, of said control electrode, via said insulating film.

2. A device according to claim 1, wherein a thickness of said insulting film continuously changes from the surface of said first semiconductor layer to the surface of said third semiconductor region, and a thickness of said insulating film above the junction of the first and second conductivity types formed between said first semiconductor layer and said third semiconductor region is larger than a thickness of said insulating film above said fourth semiconductor region.

3. A device according to claim 2, wherein said insulating film is a silicon oxide film, or has a stacked structure including a silicon oxide film and silicon nitride film.

4. A device according to claim 2, wherein the junction of the first and second conductivity types formed between said first semiconductor layer and said third semiconductor region is positioned below the end face, on the side of said third semiconductor region, of said control electrode, within a range of 0 to 0.8 $\mu$m from the end face.

5. A device according to claim 2, wherein the first impurity concentration of said first semiconductor layer is not more than $1\times10^{15}$ cm$^{-3}$, and the predetermined distance between said second and third semiconductor regions is not more than 0.5 $\mu$m.

6. A device according to claim 2, further comprising a first trench formed from the surface of said second semiconductor region to the surface of said insulating layer, and a second trench formed from the surface of said third semiconductor region to the surface of said insulating layer.

7. A device according to claim 6, further comprising a silicon oxide film, or a polysilicon film having no impurity doped therein, which is formed to fill said first and second trenches.

8. A device according to claim 1, wherein a portion of said insulating film positioned below said control electrode has a thickness of 50 to 150 nm in a thinnest portion, and a thickness of 150 to 450 nm in a thickest portion.

9. A device according to claim 8, wherein said insulating film is a silicon oxide film, or has a stacked structure including a silicon oxide film and silicon nitride film.

10. A device according to claim 8, wherein the junction of the first and second conductivity types formed between said first semiconductor layer and said third semiconductor region is positioned below the end face, on the side of said third semiconductor region, of said control electrode, within a range of 0 to 0.8 μm from the end face.

11. A device according to claim 8, wherein the first impurity concentration of said first semiconductor layer is not more than $1 \times 10^{15}$ cm$^{-3}$, and the predetermined distance between said second and third semiconductor regions is not more than 0.5 μm.

12. A device according to claim 8, further comprising a first trench formed from the surface of said second semiconductor region to the surface of said insulating layer, and a second trench formed from the surface of said third semiconductor region to the surface of said insulating layer.

13. A device according to claim 12, further comprising a silicon oxide film, or a polysilicon film having no impurity doped therein, which is formed to fill said first and second trenches.

14. A device according to claim 1, wherein said insulating film is a silicon oxide film, or has a stacked structure including a silicon oxide film and silicon nitride film.

15. A device according to claim 1, wherein the junction of the first and second conductivity types formed between said first semiconductor layer and said third semiconductor region is positioned below the end face, on the side of said third semiconductor region, of said control electrode, within a range of 0 to 0.8 μm from the end face.

16. A device according to claim 1, wherein the first impurity concentration of said first semiconductor layer is not more than $1 \times 10^{15}$ cm$^{-3}$, and the predetermined distance between said second and third semiconductor regions is not more than 0.5 μm.

17. A device according to claim 1, further comprising a first trench formed from the surface of said second semiconductor region to the surface of said insulating layer, and a second trench formed from the surface of said third semiconductor region to the surface of said insulating layer.

18. A device according to claim 17, further comprising a silicon oxide film, or a polysilicon film having no impurity doped therein, which is formed to fill said first and second trenches.

* * * * *